United States Patent
Chen et al.

(10) Patent No.: US 8,289,302 B2
(45) Date of Patent: Oct. 16, 2012

(54) OUTPUT BUFFER CIRCUIT WITH ENHANCED SLEW RATE

(75) Inventors: Yi-Jan Emry Chen, Taipei (TW);
Pang-Jung Liu, Taipei (TW);
Jyun-Ping Jiang, Taipei (TW);
Tsung-Yu Wu, Tainan (TW)

(73) Assignees: Himax Technologies Limited, Tainan County (TW); National Taiwan University, Taipei (TW)

( * ) Notice: Subject to any disclaimer, the term of this patent is extended or adjusted under 35 U.S.C. 154(b) by 955 days.

(21) Appl. No.: 12/349,432

(22) Filed: Jan. 6, 2009

(65) Prior Publication Data
US 2010/0171727 A1    Jul. 8, 2010

(51) Int. Cl.
*G06F 3/038* (2006.01)
(52) U.S. Cl. ......... 345/204; 330/255; 330/257; 330/300
(58) Field of Classification Search ............ 345/204, 345/208
See application file for complete search history.

(56) References Cited

U.S. PATENT DOCUMENTS

| | | | | |
|---|---|---|---|---|
| 5,013,940 A | * | 5/1991 | Ansel | 326/27 |
| 5,623,216 A | * | 4/1997 | Penza et al. | 326/27 |
| 6,437,645 B1 | * | 8/2002 | Ivanov et al. | 330/255 |
| 6,535,020 B1 | * | 3/2003 | Yin | 326/83 |
| 7,663,439 B2 | * | 2/2010 | Chang | 330/255 |
| 2005/0040889 A1 | * | 2/2005 | Tsuchi | 330/255 |

FOREIGN PATENT DOCUMENTS

CN        1812264 A      8/2006

* cited by examiner

*Primary Examiner* — William Boddie
*Assistant Examiner* — Sahlu Okebato
(74) *Attorney, Agent, or Firm* — Stout, Uxa, Buyan & Mullins, LLP

(57) ABSTRACT

An output buffer circuit with enhanced slew rate is disclosed. A first and a second slew-rate enhancing transistor are configured to enhance the slew rate of the source transistor and the sink transistor of an output stage. A first control circuit and a second control circuit turn off the first and the second slew-rate enhancing transistors during the static state, and turn on the first and the second slew-rate enhancing transistors during the transition.

22 Claims, 2 Drawing Sheets

OUTPUT BUFFER CIRCUIT WITH ENHANCED SLEW RATE

BACKGROUND OF THE INVENTION

1. Field of the Invention

The present invention generally relates to a buffer amplifier, and more particularly to a low-power high-speed output buffer circuit of a display panel source driver.

2. Description of the Prior Art

As resolutions of flat panel displays (such as liquid crystal displays (LCDs)) increase, thousands of output buffer amplifiers or buffer circuits ("buffers") are being built into single driver integrated circuits (ICs). In order to accommodate the huge amount of buffer amplifiers in a driver IC, the die area that is occupied by each buffer amplifier should be small, and the power, particularly the static power, consumed by each buffer amplifier should be low. Moreover, due to the long time constant of the column lines in a large-size display panel, a small settling time, or equivalently speaking, a large slew rate is necessary to provide sufficient driving capability to drive the large-size panel. In brief, a low-power high-speed output buffer circuit is becoming indispensable to the high-resolution large-size display panel.

As conventional output buffer circuits cannot effectively provide high driving capability with low-power consumption, a need has arisen to propose a novel low-power high-speed output buffer circuit with enhanced slew rate adaptable to high-resolution and/or large-size display panel.

SUMMARY OF THE INVENTION

In view of the foregoing, it is an object of the present invention to provide a buffer amplifier with enhanced slew rate, effectively offering high driving capability to the driver circuit in a flat panel display.

According to one embodiment, a first slew-rate enhancing transistor is controlled under a first control circuit to enhance current sinking capability of the sink transistor, and a second slew-rate enhancing transistor is controlled under a second control circuit to enhance current sourcing capability of the source transistor. Specifically, the first control circuit and the second control circuit turn off the first and the second slew-rate enhancing transistors during the static state. The first control circuit turns on the first slew-rate enhancing transistor during the high-to-low transition, and the second control circuit turns on the second slew-rate enhancing transistor during the low-to-high transition.

According to another embodiment, a first slew-rate enhancing transistor is controlled under a first control circuit to enhance current sourcing capability of the source transistor, and a second slew-rate enhancing transistor is controlled under a second control circuit to enhance current sinking capability of the sink transistor. Specifically, the first control circuit and the second control circuit turn off the first and the second slew-rate enhancing transistors during the static state. The first control circuit turns on the first slew-rate enhancing transistor during the low-to-high transition, and the second control circuit turns on the second slew-rate enhancing transistor during the high-to-low transition.

DETAILED DESCRIPTION OF THE INVENTION

Figure 1:
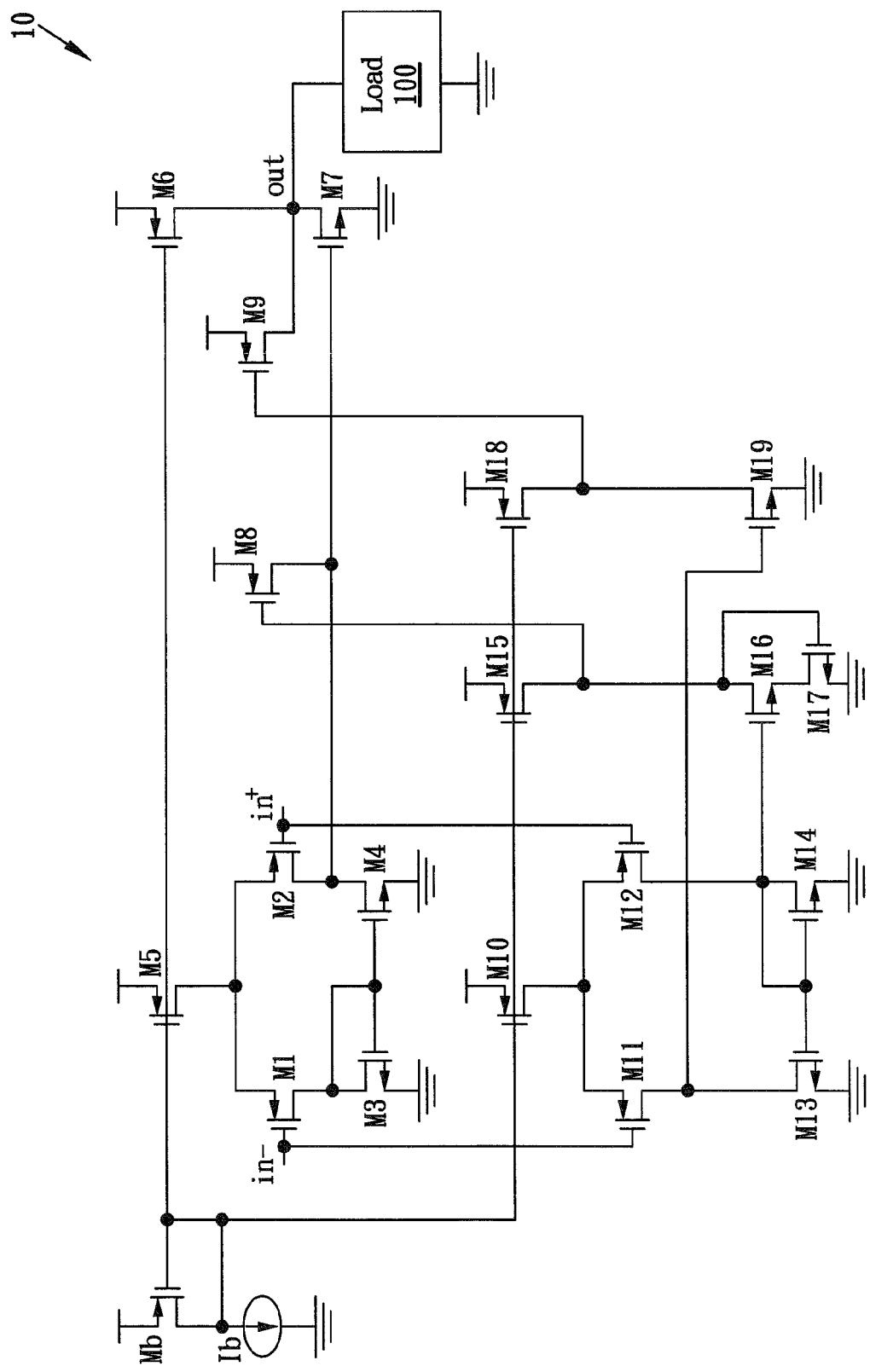
FIG. 1 shows a low-power high-speed output buffer circuit with enhanced slew rate according to one embodiment of the present invention.

FIG. 1 shows a low-power high-speed output buffer circuit 10 with enhanced slew rate according to one embodiment of the present invention. In the embodiment, the output buffer circuit 10 is adaptable, but not limited, to drive a display panel such as a liquid crystal display (LCD) (not shown in the figure) and particularly a high-resolution and/or large-size display panel.

The output buffer circuit 10 includes at least one differential pair. In the embodiment, the output buffer circuit 10 includes a first differential pair M1-M2 and a second differential pair M11-M12 that are connected in parallel. The transistors M1, M2, M11 and M12 are p-type metal oxide semiconductor transistors (PMOS). The first differential pair M1-M2 (or PMOS input stage) is biased by PMOS M5, Mb and current source $I_b$, and is actively loaded by a current mirror M3-M4, which are n-type metal oxide semiconductor transistors (NMOS). The second differential pair M11-M12 is biased by PMOS M10, Mb and the current source $I_b$, and is actively loaded by a current mirror (NMOS) M13-M14.

Serially connected source transistor (PMOS) M6 and sink transistor (NMOS) M7 form the output stage of the output buffer circuit 10. The output of the output stage M6-M7 drives a load 100, which increases in accordance with the size of the display panel. In the embodiment, a first slew-rate enhancing transistor (PMOS) M8 is configured to enhance the current sinking capability of the sink transistor M7. The first slew-rate enhancing transistor M8 is controlled by a first control circuit made of PMOS M15, NMOS M16 and NMOS M17. In the embodiment, a second slew-rate enhancing transistor (PMOS) M9 is configured to enhance the current sourcing capability of the source transistor M6. The second slew-rate enhancing transistor M9 is controlled by a second control circuit made of PMOS M18 and NMOS M19.

In operation, the first slew-rate enhancing transistor M8 is turned off in the static state, i.e., when the input signal at the input nodes in+ stably stays at high or low level (while another input node in− is connected to the output node), thereby consuming no power. Similarly, the second slew-rate enhancing transistor M9 is also turned off in the static state.

In the embodiment, during high-to-low transition, the first control circuit M15-M17 turns on the transistor M8, and, therefore, the drain of the transistor M8 is pulled to a high level. The drain of the transistor M8 is electrically coupled to control the gate of the sink transistor M7, and the gate-to-source voltage of the sink transistor M7 is pulled to a high level, thereby sinking (or discharging) current from the load 100. The turn-on transistor M8 during the high-to-low transition substantially increases the response time (or slew rate) and enhances the current sinking capability.

During low-to-high transition, the second control circuit M18-M19 turns on the transistor M9. The drain of the transistor M9 is electrically coupled to the output node of the output stage M6-M7, and the transistor M9 thus sources (or charges) current to the load 100. In other words, the transistor M9 provides supplementary source current to the load 100. As a result, the turn-on transistor M9 during the low-to-high transition substantially increases the response time (or slew rate) and enhances the current sourcing capability.

The width of the transistor M15 should be designed in a manner in which the drain-to-source voltage $V_{DS}$ of M15 is kept small in the static state such that the output of the first control circuit M15-M17 is high enough to turn off the first slew-rate enhancing transistor M8. During high-to-low transition, the current $I_D$ through the first control circuit M15-M17 increases and the drain-to-source voltage $V_{DS}$ of M15, thus, also increases. Accordingly, the output of the first control circuit M15-M17 becomes low to turn on the first slew-rate enhancing transistor M8.

Similarly, the width of the transistor M18 should be designed in a manner in which the drain-to-source voltage $V_{DS}$ of M18 is kept small in the static state such that the output of the second control circuit M18-M19 is high enough to turn off the second slew-rate enhancing transistor M9. During low-to-high transition, the current $I_D$ through the second control circuit M18-M19 increases and the drain-to-source voltage $V_{DS}$ of M18, thus, also increases. Accordingly, the output of the second control circuit M18-M19 becomes low to turn on the second slew-rate enhancing transistor M9.

Figure 2:
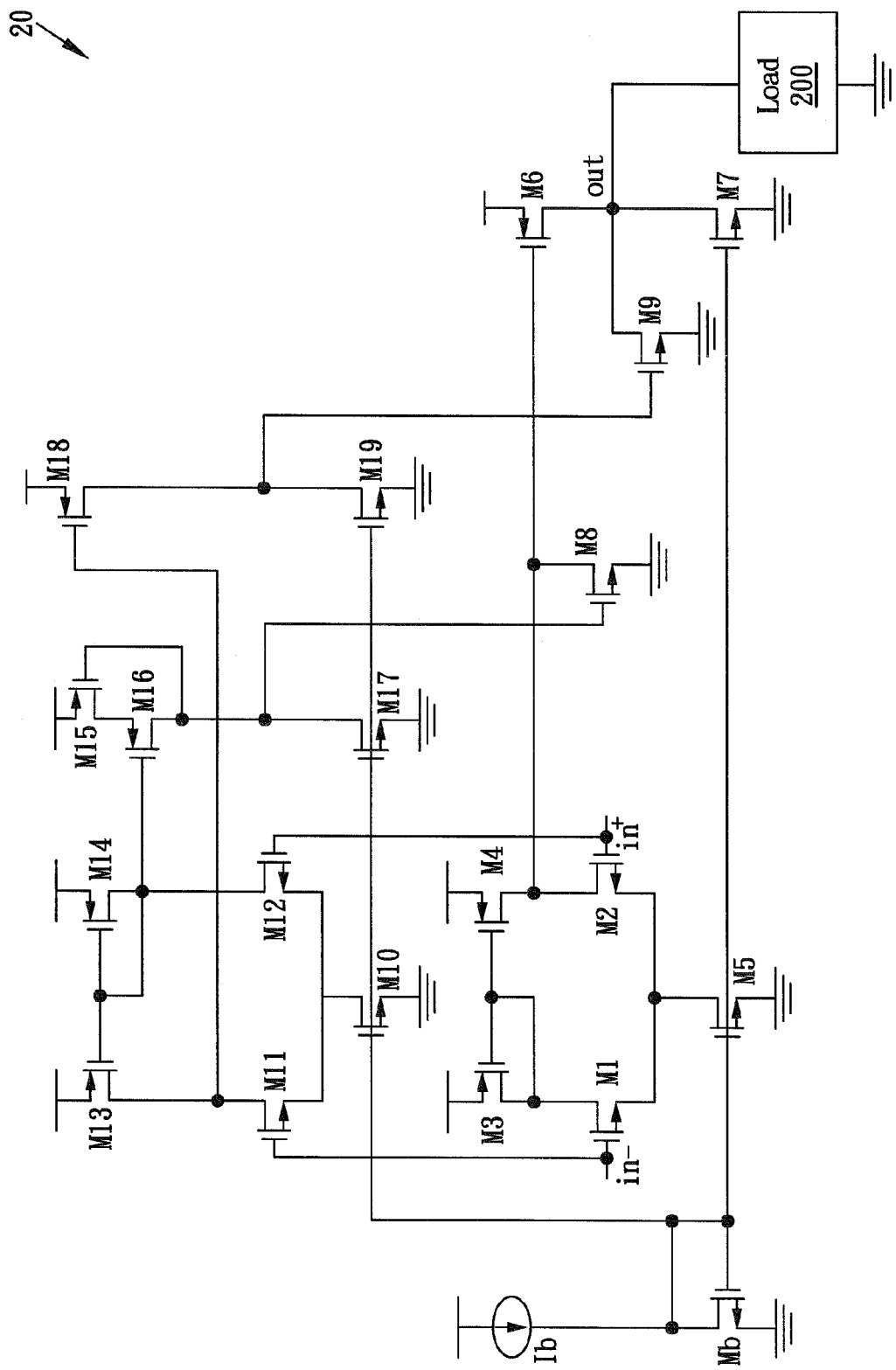
FIG. 2 shows a low-power high-speed output buffer circuit with enhanced slew rate according to another embodiment of the present invention.

FIG. 2 shows a low-power high-speed output buffer circuit 20 with enhanced slew rate according to another embodiment of the present invention. In the embodiment, the configuration of the output buffer circuit 20 is similar to the configuration of the output buffer circuit 10 in FIG. 1.

Specifically, the output buffer circuit 20 includes a first differential pair (NMOS) M1-M2 (or NMOS input stage), which is biased by (NMOS) M5, Mb and current source $I_b$, and is actively loaded by a current mirror (PMOS) M3-M4. The output buffer circuit 20 also includes a second differential pair (NMOS) M11-M12, which is connected in parallel to the first differential pair M1-M2. The second differential pair M11-M12 is biased by (NMOS) M10, Mb and the current source $I_b$, and is actively loaded by a current mirror (PMOS) M13-M14. Serially connected source transistor (PMOS) M6 and sink transistor (NMOS) M7 form the output stage of the output buffer circuit 20. The output node of the output stage M6-M7 drives a load 200. In the embodiment, a first slew-rate enhancing transistor (NMOS) M8 is configured to enhance the current sourcing capability of the source transistor M6. The first slew-rate enhancing transistor M8 is controlled by a first control circuit made of PMOS M15, PMOS M16 and NMOS M17. In the embodiment, a second slew-rate enhancing transistor (NMOS) M9 is configured to enhance the current sinking capability of the sink transistor M7. The second slew-rate enhancing transistor M9 is controlled by a second control circuit made of PMOS M18 and NMOS M19.

In operation, the first slew-rate enhancing transistor M8 and the second slew-rate enhancing transistor M9 are turned off in the static state. In the embodiment, during low-to-high transition, the first control circuit M15-M17 turns on the transistor M8, and, therefore, the drain of the transistor M8 is pulled low. The drain of the transistor M8 is electrically coupled to control the gate of the source transistor M6, and the source-to-gate voltage of the source transistor M6 is pulled to a high level, thereby sourcing (or charging) current to the load 200. The turn-on transistor M8 during the low-to-high transition substantially increases the response time (or slew rate) and enhances the current sourcing capability.

During high-to-low transition, the second control circuit M18-M19 turns on the transistor M9. The drain of transistor M9 is electrically coupled to the output of the output stage M6-M7, and the transistor M9 thus sinks (or discharges) current from the load 200. In other words, the transistor M9 provides supplementary sink current from the load 200. As a result, the turn-on transistor M9 during the high-to-low transition substantially increases the response time (or slew rate) and enhances the current sinking capability.

The width of the transistor M17 should be designed in a manner in which the drain-to-source voltage $V_{DS}$ of M17 is kept small in the static state such that the output of the first control circuit M15-M17 is low enough to turn off the first slew-rate enhancing transistor M8. During low-to-high transition, the current $I_D$ through the first control circuit M15-M17 increases and the drain-to-source voltage $V_{DS}$ of M17, thus, also increases. Accordingly, the output of the first control circuit M15-M17 becomes high to turn on the first slew-rate enhancing transistor M8.

Similarly, the width of the transistor M19 should be designed in a manner in which the drain-to-source voltage $V_{DS}$ of M19 is kept small in the static state such that the output of the second control circuit M18-M19 is low enough to turn off the second slew-rate enhancing transistor M9. During high-to-low transition, the current $I_D$ through the second control circuit M18-M19 increases and the drain-to-source voltage $V_{DS}$ of M19 thus also increases. Accordingly, the output of the second control circuit M18-M19 becomes high to turn on the second slew-rate enhancing transistor M9.

Although specific embodiments have been illustrated and described, it can be appreciated by those skilled in the art that various modifications may be made without departing from the scope and spirit of the present invention, which is intended to be limited solely by the appended claims.

What is claimed is:

1. An output buffer circuit with enhanced, slew rate, comprising:
   an output stage including a source transistor and a sink transistor for driving a, load;
   a first slew-rate enhancing transistor configured to enhance slew rate of one of the source transistor and the sink transistor;
   a second slew-rate enhancing transistor configured to enhance slew rate of the other of the source transistor and the sink transistor;
   a first control circuit configured to control the first slew-rate enhancing transistor; and
   a second control circuit configured to control the second slew-rate enhancing transistor;
   wherein the first control circuit and the second control circuit turn off the first slew-rate enhancing transistor and the second slew-rate enhancing transistor respectively during static state, and turn on the first slew-rate enhancing transistor and the second slew-rate enhancing transistor respectively during transition.

2. The output buffer circuit of claim 1, wherein the load is a display panel.

3. The output buffer circuit of claim 1, further comprising an input stage for receiving an input signal.

4. The output buffer circuit of claim 3, wherein the input stage comprises at least one differential pair.

5. An output buffer circuit with enhanced slew rate, comprising:
   an input stage for receiving an input signal;
   an output stage including a source transistor and a sink transistor for driving a load;
   a first slew-rate enhancing transistor configured to enhance current sinking capability of the sink transistor;
   a second slew-rate enhancing transistor configured to enhance current sourcing capability of the source transistor;
   a first control circuit configured to control the first slew-rate enhancing transistor; and
   a second control circuit configured to control the second slew-rate enhancing transistor;
   wherein the first control circuit and the second control circuit turn off the first slew-rate enhancing transistor and the second slew-rate enhancing transistor respectively during static state, the first control circuit turns on the first slew-rate enhancing transistor during high-to-low transition, and the second control circuit turns on the second slew-rate enhancing transistor during low-to-high transition.

6. The output buffer circuit of claim 5, wherein, the load is a display panel.

7. The output buffer circuit of claim 5, wherein the input stage comprises at least one differential pair.

8. The output buffer circuit of claim 7, wherein the at least one differential pair includes two differential pairs connected in parallel.

9. The output buffer circuit of claim 5, wherein the input stage includes a p-type metal oxide semiconductor (PMOS) input stage.

10. The output buffer circuit of claim 5, wherein the first slew-rate enhancing transistor is a PMOS transistor having a drain coupled to control a gate of the sink transistor, and wherein, during the high-to-low transition, the turn-on of the first slew-rate enhancing transistor turns on the sink transistor, thereby sinking current from the load.

11. The output buffer circuit of claim 10, wherein the first control circuit includes a PMOS composing transistor having a width designed in a manner that a drain of the PMOS composing transistor in the static state has potential high enough to turn off the first slew-rate enhancing transistor, and wherein, during the high-to-low transition, the drain of the PMOS composing transistor has potential low enough to turn on the first slew-rate enhancing transistor.

12. The output buffer circuit of claim 5, wherein the second slew-rate enhancing transistor is a PMOS transistor having a drain coupled to an output node of the output stage, and wherein, during the low-to-high transition, the turn-on of the second slew-rate enhancing transistor provides source current to the load.

13. The output buffer circuit of claim 12, wherein the second control circuit includes a PMOS composing transistor having a width designed in a manner that a drain of the PMOS composing transistor in the static state has potential high enough to turn off the second slew-rate enhancing transistor, and wherein, during the low-to-high transition, the drain of the PMOS composing transistor has potential low enough to turn on the second slew-rate enhancing transistor.

14. An output buffer circuit with enhanced slew rate, comprising:
an input stage for receiving an input signal;
an output stage including a source transistor and a sink transistor for driving a load;
a first slew-rate enhancing transistor configured to enhance current sourcing capability of the source transistor;
a second slew-rate enhancing transistor configured to enhance current sinking capability of the sink transistor;
a first control circuit configured to control the first slew-rate enhancing transistor; and
a second control circuit configured to control the second slew-rate enhancing transistor;
wherein the first control circuit and the second control circuit turn off the first slew-rate enhancing transistor and the second slew-rate enhancing transistor respectively during static state, the first control circuit turns on the first slew-rate enhancing transistor during low-to-high transition, and the second control circuit turns on the second slew-rate enhancing transistor during high-to-low transition.

15. The output buffer circuit of claim 14, wherein the load is a display panel.

16. The output buffer circuit of claim 14, wherein the input stage comprises at least one differential pair.

17. The output buffer circuit of claim 16, wherein the at least one differential pair includes two differential pairs connected in parallel.

18. The output buffer circuit of claim 14, wherein the input stage includes an n-type metal oxide semiconductor (NMOS) input stage.

19. The output buffer circuit of claim 14, wherein the first slew-rate enhancing transistor is an NMOS transistor having a drain coupled to control a gate of the source transistor, and wherein, during the low-to-high transition, the turn-on of the first slew-rate enhancing transistor turns on the source transistor thereby sourcing current to the load.

20. The output buffer circuit of claim 19, wherein the first control circuit includes an NMOS composing transistor having a width designed in a manner that a drain of the NMOS composing transistor in the static state has potential low enough to turn off the first slew-rate enhancing transistor, and wherein, during the low-to-high, transition, the drain of the NMOS composing transistor has potential high enough to turn on the first slew-rate enhancing transistor.

21. The output buffer circuit of claim 14, wherein the second slew-rate enhancing transistor is an NMOS transistor having a drain coupled to an output node of the output stage, and wherein, during the high-to-low transition, the turn-on of the second slew-rate enhancing transistor sinks current from the load.

22. The output buffer circuit of claim 21, wherein the second control circuit includes an NMOS composing transistor having a width designed in a manner that a drain of the NMOS composing transistor in the static state has potential low enough to turn off the second slew-rate enhancing transistor, and wherein, during the high-to-low transition, the drain of the NMOS composing transistor has potential high enough to turn on the second slew-rate enhancing transistor.

* * * * *